(12) United States Patent
Loicq et al.

(10) Patent No.: US 8,960,968 B2
(45) Date of Patent: Feb. 24, 2015

(54) METHOD OF MANUFACTURING AN IMPROVED OPTICAL LAYER FOR A LIGHT EMITTING DEVICE WITH SURFACE NANO-MICRO TEXTURATION BASED ON COHERENT ELECTROMAGNETIC RADIATION SPECKLE LITHOGRAPHY

(75) Inventors: Jerome Loicq, Villers-aux-Tours (BE); Karl Fleury-Frenette, Seraing (BE); Denis Vandormael, Vezin (BE)

(73) Assignee: Universite de Liege, Angleur (BE)

( * ) Notice: Subject to any disclaimer, the term of this patent is extended or adjusted under 35 U.S.C. 154(b) by 0 days.

(21) Appl. No.: 13/823,261

(22) PCT Filed: Sep. 16, 2011

(86) PCT No.: PCT/EP2011/066155
§ 371 (c)(1),
(2), (4) Date: Mar. 14, 2013

(87) PCT Pub. No.: WO2012/069224
PCT Pub. Date: May 31, 2012

(65) Prior Publication Data
US 2013/0182445 A1    Jul. 18, 2013

(30) Foreign Application Priority Data
Nov. 24, 2010   (EP) .................................... 10192455

(51) Int. Cl.
*F21V 3/00*     (2006.01)
*G02B 5/02*     (2006.01)
*H01L 51/52*    (2006.01)
*G01J 1/04*     (2006.01)

(52) U.S. Cl.
CPC .............. *G02B 5/02* (2013.01); *H01L 51/5268* (2013.01); *G01J 1/0407* (2013.01); *H01L 51/52* (2013.01)
USPC ................................. 362/311.02; 362/311.01

(58) Field of Classification Search
USPC ...................................................... 362/311.02
See application file for complete search history.

(56) References Cited

U.S. PATENT DOCUMENTS

| | | |
|---|---|---|
| 5,973,336 A | 10/1999 | Hanke |
| 6,177,761 B1 | 1/2001 | Pelka |
| 6,346,771 B1 | 2/2002 | Salam |
| 2007/0029560 A1 | 2/2007 | Su |
| 2007/0194341 A1 | 8/2007 | Chang |
| 2007/0241355 A1 | 10/2007 | Chua |
| 2008/0173887 A1 | 7/2008 | Baba |

FOREIGN PATENT DOCUMENTS

| | | |
|---|---|---|
| EP | 0 977 277 | 2/2000 |
| EP | 0 977 280 | 2/2000 |
| EP | 1 855 327 | 11/2007 |
| JP | 2009-105229 | 5/2009 |
| WO | 95/03935 | 2/1995 |
| WO | 03/101157 | 12/2003 |
| WO | 2006/096767 | 9/2006 |

*Primary Examiner* — Mary Ellen Bowman
(74) *Attorney, Agent, or Firm* — Jacobson Holman Hershkovitz, PLLC

(57) ABSTRACT

An object of the present invention is to provide a cheap, rapid, controlled, reproducible and polyvalent method for manufacturing a light emitting device with an internal source of light capable of achieving an enhancement in extraction efficiency. The invention proposes a method for manufacturing an optical layer for a light emitting device having an internal source of light and an optical layer separating the internal source of light and an external medium of light diffusion, wherein the method comprises the use of coherent electromagnetic radiation speckle lithography, such as laser speckle lithography, to make a nano/micro texturation on at least one surface of the optical layer.

20 Claims, 5 Drawing Sheets

METHOD OF MANUFACTURING AN IMPROVED OPTICAL LAYER FOR A LIGHT EMITTING DEVICE WITH SURFACE NANO-MICRO TEXTURATION BASED ON COHERENT ELECTROMAGNETIC RADIATION SPECKLE LITHOGRAPHY

The invention relates to a method for manufacturing an optical layer that improves outcoupling efficiency and overpass total internal reflection phenomenon (TIR) in a light emitting device having an internal source of light, the optical layer separating the internal source of light and an external medium of light diffusion. The invention also relates to a method for manufacturing a light emitting device with the improved optical layer. The invention also relates to a light emitting device with the improved optical layer The light emitting device may be a light emitting diode (LED), and more specifically an organic-LED (OLED), but are not limited to these devices.

Light rays generated in a luminescent medium with higher index of refraction than the exit medium, typically air, are submitted to TIR. Consequently, rays which are in the conditions of TIR will be trapped and guided into the material. These rays will not be allowed to be extracted out of the light emitting device. Because light is generated without any preferential direction, these trapping effects affect the outcoupling efficiency of the light emitting device.

Typical devices concerned by such phenomenon are LED or OLED for instance, and all sources which could be seen as an internal source with higher refractive index than the exit medium. An internal source is a source of light embedded in a material in which the light is generated, the material having an index of refraction higher than 1, as air or vacuum. Other example of internal source may be a glass layer in which fluorescent or phosphorescent components are included (dyes, metal and/or semiconductor nanoparticles, etc.) excited by an external source (laser, arc lamp, electric field, etc.). The molecules/quantum dots are excited by the external source and de-energize by emitting a photon in a random direction. Because of this non-preferential direction, a number of photons are in conditions of total internal reflection. They are trapped and guided in luminescent layers, the substrate and cover/or encapsulation layers.

An OLED device is a light production system based on luminescent organic layers between two electrodes, at least one of which being transparent. Photons are created in these luminescent organic layers with arbitrary direction i.e. without any preferential emission direction. Due to classical OLED geometry, the source is considered as planar, internal and lambertian. Therefore, such internal sources are rather different than punctual and external sources like common incandescent lamps or fluorescent tube, for instance.

The external medium of light diffusion, as air or vacuum, has a refractive index lower than the source of light. Because the refractive index of the lighting medium is higher than the exit medium, light rays are submitted to TIR, which involves many optical losses in the exit direction of light. The trapped light is then reabsorbed in the device and could turn into heat that may impacts the device performances and lifetime.

The amount of trapped energy is highly dependent of the values of the index of refraction involved in the technology stack defining the light emitting device and the exit medium. Indeed, the rays having an angle of incidence comprised between 0° (perpendicular to the interface between the stack and the exit medium) and a critical angle θc are transmitted to the exit medium. The rays having an angle of incidence higher than the critical angle are trapped, i.e. not transmitted to the exit medium.

In OLED device, light is mainly trapped in the transparent substrate or cover (depending of the OLED configuration: bottom or top emitting) and the electroluminescent layers.

As example an interface between photon creations medium with a refractive index of 1.7 and the air, induces a global transmission of 16.7% for a planar and lambertian source.

With a simple analytical model based on Fresnel reflection and Snell's laws, the amount of trapped energy in transparent substrate or cover and luminescent is evaluated. A picture of calculation configuration is presented on FIG. 1 for a bottom emitting device. Calculation is performed by rays emitted on the hemisphere H included in the luminescent layers. As a first approach, luminescent layers are considered as semi-infinite medium.

Integrated normalized transmission of the interface is given by the following relation:

$$T = \frac{\int_0^{2\pi} \int_0^{\pi/2} f(\theta) T(\theta) \sin(\theta) d\theta d\phi}{\int_0^{2\pi} \int_0^{\pi/2} \sin(\theta) d\theta d\phi}$$

where $T(\theta)$ is the transmission function of the interface governed by the Fresnel reflection law and $f(\theta)$ is the normalized layer emission function. In the present case the medium corresponds to an isotropic and semi-infinite medium. Consequently, the amount of rays arising from all the hemispheric direction is constant, and $f(\theta)=1$.

FIG. 2 illustrate the phenomenon of TIR in the case of interface glass-air. Transmittance presents a critical angle, called angle-cutoff.

As it may be seen, a p-polarized light is better transmitted to the external medium than non polarized light for a determined range of angle of incidence (10°-40°). It is the contrary for s-polarized light. But FIG. 2 also shows that the angle-cutoff is the same for s-polarized light, p-polarized light and non polarized light. This angle is therefore representative to the inside and outside refractive index ratio.

The next table shows different case of refraction index transition. The non transmitted photons are then guided in the layers. These are reabsorbed by the layers and may increase the temperature, which is a main drawback.

| n1 (source medium) | n2 (exit medium) | Critical angle | Transittance (%) |
| --- | --- | --- | --- |
| 1.5 | 1 | 41.8° | 22.3 |
| 1.6 | 1 | 38.7° | 19.5 |
| 1.7 | 1 | 36.03° | 16.7 |
| 1.6 | 1.5 | 69.6° | 63.3 |
| 1.7 | 1.5 | 61.9° | 50.6 |
| 1.7 | 1.6 | 70.3 | 64.3 |

In the context of internal planar source and in the simple case of interface between glass and air, the amount of trapped energy inside the glass material is very huge as presented on that table. Only 22.3% of generated light in the glass material (n=1.5) could be transmitted outside air. Consequently, the effect of TIR is rather important. These results show equally that exists a huge potential to retrieve energy out of OLED with an adequate management of light.

Various solutions have been proposed to improve outcoupling efficiency and overpass TIR phenomenon.

These solutions could be summarizing into three main topics:
1) Geometric Solution:
    Hanke et al.: U.S. Pat. No. 5,973,336A
    D. Pelka: EP1157420,
    Salam Hassan Paddy: U.S. Pat. No. 6,346,771
2) Micro-Technology Solution
    Kyong et al.: EP1855327A2,
    Heremans: EP0977280A3, EP0977280A2, EP0977277A1
    Erchak: WO200696767
    Baba ToshihiKo: US2008/0173887
    J. Magno: WO03/101157
3) Index Matching
    Chang Myung Whun: US20070194341
    Su Jung-Chieh: US20070029560

The solutions described in these documents do not enhance sufficiently outcoupling efficiency and are difficult and/or expensive to perform.

Document WO 95/03935 concerns a process for homogenisation of an external light source. In the case of external sources, the light is not trapped inside the source. This document does not concern the problem of Total Internal Reflexion (TIR) phenomenon because the light is always in air.

Document JP 2009 105229 relates to a method of homogenisation and shaping light emitted by a LED. In this document, LED is defined as "a point source with a strong directivity". Thus, there is no problem of TIR.

An object of the present invention is to provide a cheap, rapid, controlled, reproducible and polyvalent method for manufacturing a light emitting device with an internal source of light capable of achieving an enhancement in extraction efficiency.

The invention proposes to use coherent electromagnetic radiation speckle lithography, in particular laser-light speckle photolithography, to improve outcoupling efficiency of an optical layer intended to be used in light emitting device having an internal source of light. The invention relates to a method for manufacturing an optical layer for a light emitting device having an internal source of light and an optical layer separating the internal source of light and an external medium of light diffusion, characterized in that it comprises the use of coherent electromagnetic radiation speckle lithography, such as laser speckle lithography, to make a nano/micro texturation on at least one surface of the optical layer.

According to other embodiments:
the method may comprise the following steps:
    a) providing a sensitive material, like a photoresin, chosen to have a linear sensibility in the range of wavelength of a coherent electromagnetic radiations source to be used;
    b) recording an intensity pattern generated by coherent electromagnetic radiations speckle onto the sensitive material;
    c) replicating the nano/micro texturation by nano-imprint technique onto at least one surface of the optical layer;
step b) may comprise the following steps:
    b1) providing a laser as coherent electromagnetic radiations source, and a photosensitive material as sensitive material, a laser beam expander and a light diffuser, the laser having a wavelength in the range of photosensitive material sensibility;
    b2) arranging the photosensitive material at a distance (d) of the light diffuser determined in function of an expected speckle grain mean size of the pattern;
    b3) actuating the laser in direction of the light diffuser through the laser beam expander to expand the laser beam and then to diffuse the expanded laser beam, thus generating a laser speckle.
    b4) exposing the photosensitive material by the laser speckle in order to generate a photosensitised part in the photosensitive material;
    b4) removing the photosensitised part to reveal a nano/micro texturation on a part of the photosensitive material not having been exposed to the laser speckle;
the light diffuser may comprise an adjustable optical aperture means, and in step b2) distance (d) of the light diffuser and optical aperture of the adjustable optical aperture means are both determined in function of the expected speckle grain mean size;
in step b4) the illuminated photosensitive material may be immersed in solvent which removes linearly the photosensitized part from the photosensitive material;
step c) may comprise the following steps:
    c1) using the part of the sensitive material not having been exposed to the coherent electromagnetic radiations speckle as a nano/micro textured master;
    c2) preparing a micro/nano textured mould by coating the nano/micro textured master with a solidifiable material such as a poly-dimethyl siloxane (PDMS) gel;
    c3) performing a conformal solidification and, after conformal solidification, removing the solidified material by peeling it off from the nano/micro textured master, to obtain a micro/nano textured mould;
    c4) coating a first surface of a substrate to be used as the optical layer with a UV-curable resin;
    c5) placing the micro/nano textured mould in contact with the coated first surface of the substrate, the micro/nano texturation of the mould facing the first surface, such that the micro/nano texturation is immersed in the UV-curable resin;
    c6) illuminating the UV-curable liquid photopolymer resin with UV light whereby inducing the hardening of the said photopolymer resin by photopolymerization to generate a positive replica of the mould on the substrate;
    c7) separating the positive replica from the mould to obtain an optical layer with a nano/micro texturation on one surface of the optical layer;
step c) may further comprise the following steps:
    c8) coating a second surface of the substrate, opposite to the first micro/nano textured surface, with a UV-curable resin;
    c9) repeating steps c5) to c7) to obtain an optical layer with a nano/micro texturation on two surfaces of the optical layer.

The invention also relates to a method for testing the optical layer manufactured by the manufacturing method according to the invention, the method for testing comprising the following steps:
    α) providing a light device able to generate a laser beam, an integrated sphere having a light inlet and a light outlet, an hemispherical lens with a flat face and an hemispherical face, a photo detector, an recorder of a light signal extraction detected by the photo detector, and an optical layer having at least one surface with a nano/micro texturation made by laser speckle lithography
    β) placing the optical layer facing the light inlet, and the flat face of the hemispherical lens in contact with the optical layer;
    γ) placing the photo detector facing the light outlet
    δ) actuating the light device to generate a laser beam and moving the light device such as the laser beam is directed to the hemispherical face of the hemispherical lens with a normal incidence and go through the lens and intercepts the optical layer with an angle of incidence changing while the light device moves;

ε) recording the light signal extraction detected by the photo detector

The light inlet and the light outlet may be arranged with an angle of 90° between each other.

The invention also relates to a light emitting device with an internal source of light and an optical layer separating the internal source and external medium, susceptible to be obtained by the manufacturing method according to the invention, wherein the optical layer comprises at least one surface with nano/micro texturation based on coherent electromagnetic radiation speckle lithography, in particular laser speckle lithography.

According to other embodiments:
the nano/micro texturation may comprise bumps having height following a statistic distribution showing one peak;
the optical layer may comprises at least one surface with nano/micro texturation having bump average size/diameter in the range of 200 nm to 20 µm, preferably in the range of 200 nm to 5 µm, more preferably around 500 nm, having a distance between bumps in the range of 200 nm to 20 µm, preferably in the range of 200 nm to 5 µm, more preferably around 500 nm, respectively with a ratio between the length and the distance between speckle grains in the range of 0.5 to 5, preferably in the range of 2 to 4, more preferably of 4.

A method to characterize an optical layer made by the manufacturing method according to the invention is also described. It comprises the following steps:
performing a scanning electron microscope photography to obtain a speckle grain pattern;
performing a Fourier transform of the speckle grain pattern shows a peak corresponding to spatial frequency associated with the diametre/size of grain.

The accompanying drawings, which are included to provide a further understanding of the invention and to illustrate embodiment(s) of the invention together with the description serve to explain the principle of the invention. In the drawings.

Figure 1:
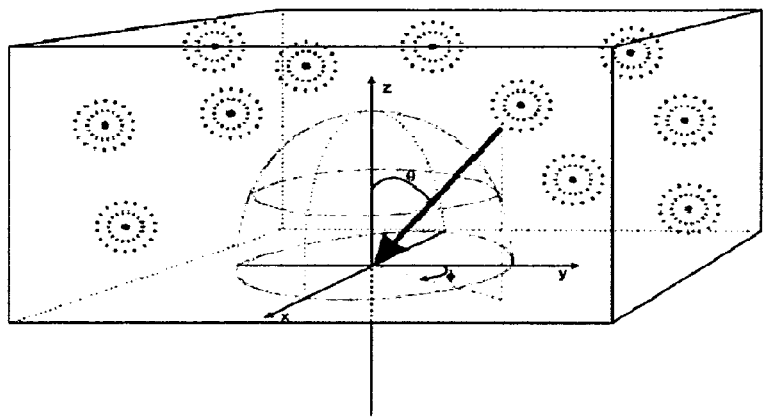
FIG. 1 is a perspective view illustrating a theoretical picture of calculation configuration for a bottom emitting device.
Figure 2:
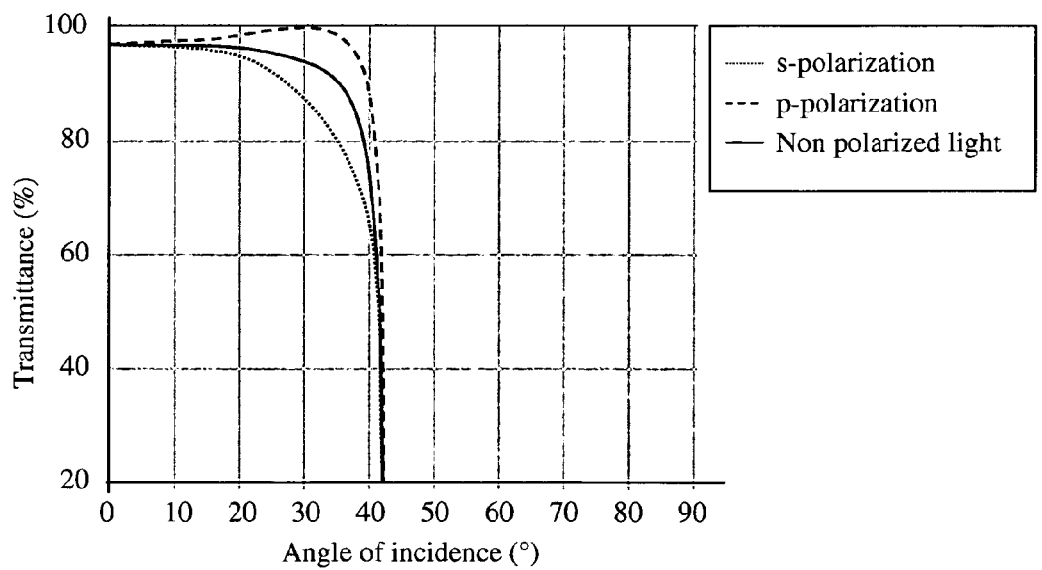
FIG. 2 is a graph depicting the evolution of transmittance of polarized and non polarized lights depending on an increase in the refractive index of a hemisphere in FIG. 1.

The method according to the invention aims at manufacturing an optical layer intended to be used in a light emitting device having an internal source of light. As example: this source of light can be a self emitting source such as a source constituted by chemical products reacting with emission of a photon. The product can be stored in separate containers that need to be broken to allow the products to react.

The internal source can also need means to be actuated. For example, these actuating means can be electrical means, such as electrodes (in an LED or OLED for example).

The optical layer is provided to separate the internal source of light and the external medium where the light has to diffuse.

The invention proposes to use coherent electromagnetic radiation speckle lithography, in particular laser-light speckle photolithography, to produce random surface with controlled parameters to enhance the OLED outcoupling.

Speckle lithography can also be maser lithography, radar lithography, etc.

Speckle phenomenon is due to the combination of coherent electromagnetic radiation (for example light provided by laser) and diffusing surfaces. Speckle phenomenon is a statistic interference made on a screen of interest (sensitive material, CCD camera, eyes, etc.). The speckle forms a random pattern in space which is stationary in time but highly fluctuating from point to point.

This interaction between coherent electromagnetic radiation and a diffuser results in the formation of "speckle grain" having a size and a shape depending on the wavelength of the coherent electromagnetic radiations and depending on the diffuser.

Indeed, speckle is composed of "grains of light energy" distributed randomly in space: the grains are randomly distributed along x and y axis, and may pile up along z axis. Nevertheless, the average size of these grains is given by the airy function of the optical system. This size is adjustable and controllable by the characteristic parameters of the optical setup (aperture of the coherent electromagnetic radiation diffuser 30, distance between the diffuser and the sensitive material). The shape and the size of the speckle grains are not distributed randomly.

Laser speckle grains are generally ellipsoid characterized by an average diameter and light intensity profile. Speckle grains intensity follows a statistical law corresponding to a negative exponential probability distribution. The average size of the speckle grains is given by the following relation:

$$\Delta d = \frac{\lambda z \pi}{D}$$

where λ is the wavelength, z the distance between diffuser and sensitive material, and D the aperture size.

Indeed, in section, speckle grains present a specific intensity profile (for example Gaussian, $\sin^2$, lorentzian, etc. and a combination thereof): the core of the grain has stronger energy than the peripheral surface of the grain. The intensity profile depends on the source (for example, a laser beam is a gaussian source) and depends on the diffuser.

Because average speckle grain size could be determined in a given situation by the parameters of the experimental setup, speckle could be seen as a quasi-periodic system and not as a periodic system. In other words, with speckle, only the space distribution of the micro/nano texturation is random. The size is not randomly distributed.

By opposition, with a periodic system, the space distribution and the size of the micro/nano texturation are random.

Next, these speckle grains are distributed randomly on the surface of a sensitive material (such as a photosensitive resin) which converts energy of the grains into height profile constituting a nano/micro texturation on at least one surface of the optical layer. Consequently, the surface is composed by bumps with specific relief shape profile. These bumps are then distributed randomly on the surface of interest following distribution of speckle grain.

In function of optical parameters, the results are a random shape which could be assimilated to have similar outcoupling properties as a corrugated surface, but with an easier and cheaper method of manufacturing. The inventors have established that this random shape surface exhibits light extraction enhancement properties.

More precisely, the method according to the invention comprises the general following steps:
a) providing a sensitive material, like a photoresin, chosen to have a linear sensibility in the range of wavelength of the coherent electromagnetic radiations source (such as a laser) to be used;
b) recording an intensity pattern generated by coherent electromagnetic radiations speckle onto the sensitive material (for example a photosensitive material);
c) replicating the nano/micro texturation by nano-imprint technique onto at least one surface of the optical layer.

Sensibility of a photoresin is an intrinsic parameter. Sensibility gives the conversion of light energy dose deposited onto photoresin into height after development. A typical sensibility curve is characterized by three zones: a first zone without any effects (no height conversion), a second zone which is linear in function of deposited light dose and a third zone which is characterized by saturation effect.

Figure 3:
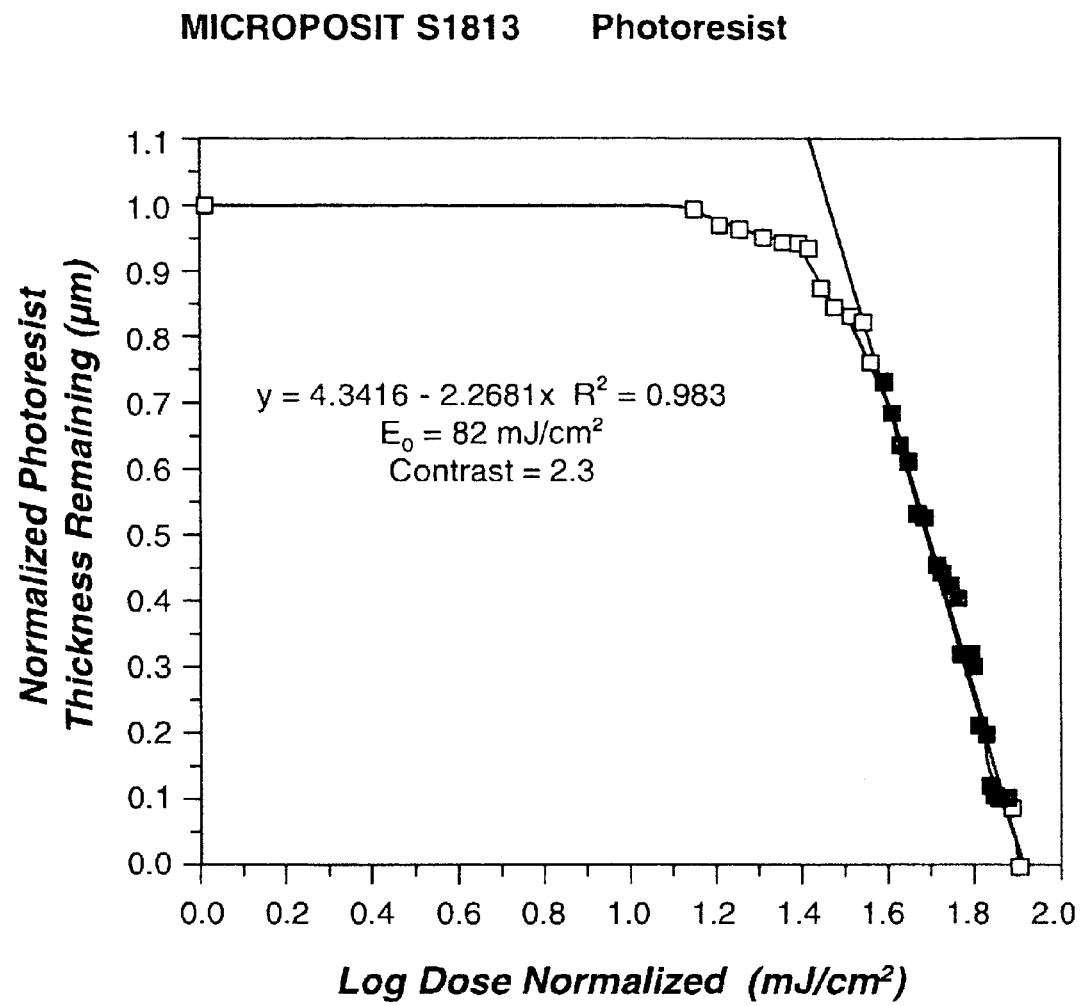
FIG. 3 is a graph depicting an example of a sensibility curve of a photoresin (curve extracted out of Shypley Microposit® S1800® series photoresits datasheets)

The graph of FIG. 3 gives the sensibility curve (or contrast curve) of an example of a photoresin. This curve is given by the manufacturer of the photoresin (curve extracted out of Shypley Microposit® S1800® series photoresits datasheets).

Figure 4:
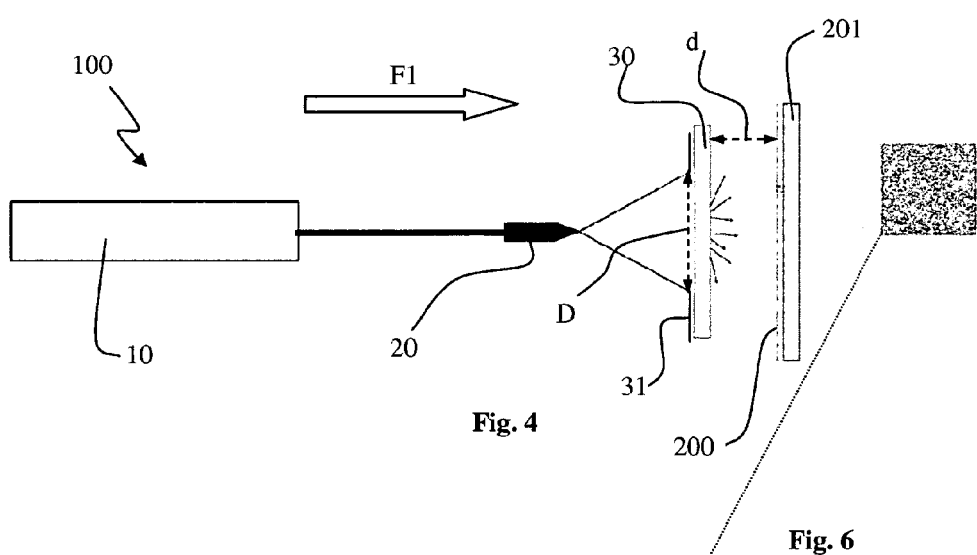
FIG. 4 is a schematic view illustrating an embodiment of a device for carrying out the manufacturing method according to the invention.

An embodiment of a device for carrying out the manufacturing method according to the invention is illustrated in FIG. 4.

This device 100 comprises (step b1)) successively, in the direction of light emission F1, a laser 10 as coherent electromagnetic radiations source. The laser have a wavelength in the range of the photosensitive material sensibility, a laser beam expander 20 and a light diffuser 30. The photosensitive material 200 is arranged (step b2)) facing the light diffuser (considering the direction F1) at a distance (d) of the light diffuser in order to receive laser speckle. Distance (d) is determined in function of an expected speckle grain mean size of the pattern.

Advantageously, the light diffuser 30 comprises an adjustable optical aperture means 31. Therefore, in step b2), distance (d) and optical aperture (D) of the adjustable optical aperture means 31 are both determined in function of the expected speckle grain size (or average diameter).

The photosensitive material 200 is preferably coated on a substrate 201, such as a glass layer, for easier manipulation.

The method according to the invention further comprises the following steps:
b3) actuating the laser 10 in direction of the light diffuser 30 through the laser beam expander 20 to expand the laser beam and then to diffuse the expanded laser beam, thus generating a laser speckle.
b4) exposing the photosensitive material 200 to the laser speckle in order to generate a photosensitised part in the photosensitive material; The intensity modulation is transferred to material and converted into surface relief profile.
b5) removing the photosensitised part to reveal a nano/micro texturation on a part of the photosensitive material not having been exposed to the laser speckle. To this aim, the illuminated photosensitive material 200 is immersed in a solvent which removes linearly the photosensitised part from the photosensitive material.

This operation is called "master generation".

Thus, laser speckle is recorded onto photosensitive material 200 which is coated on a glass substrate 201.

Figure 5:
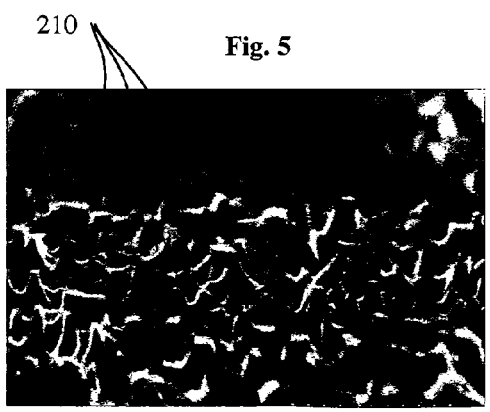
FIGS. 5 and 6 are photography taken with an electronic microscope depicting, respectively, a cut view and a top view of a surface of an optical layer comprising speckle grain size shape recorded onto its surface obtain by laser speckle lithography.
Figure 6:
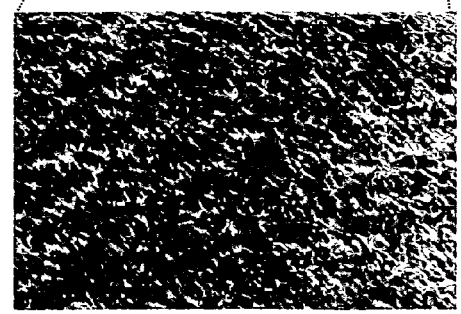

Results of such records are illustrated in FIGS. 5 and 6.

Optical parameters are chosen to have speckle grain sizes around 600 nm of diameter with an aspect ratio between 4 and 5. This size is chosen in the range of visible wavelength dimensions. Aspect ratio is defined as the ratio of the between the length (Z-direction) and the distance between speckle grains (X-Y plane).

After step b), the mould is then replicated by nano-imprint technique onto optical layers.

Figure 9:
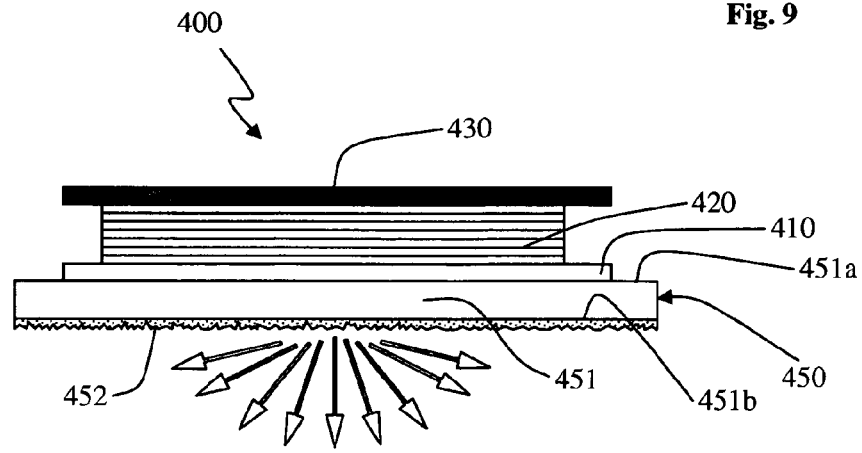
FIG. 9 is a sectional view illustrating an embodiment of an organic light emitting device of bottom emitting configuration having an optical layer comprising nano/micro texturation based on laser speckle lithography.

This step c) advantageously comprises the following steps:
c1) using the part of the photosensitive material not having been exposed to the laser speckle and presenting a micro/nano textured surface as a nano/micro textured master;
c2) preparing a micro/nano textured mould by coating the nano/micro textured master with a solidifiable material such as a poly-dimethyl siloxane (PDMS) gel;
c3) performing a conformal solidification and, after conformal solidification, removing the solidified material by peeling it off from the nano/micro textured master, to obtain an inverted micro/nano textured mould;
c4) coating a first surface of a light emitting substrate/cover to be used as the optical layer with a UV-curable resin;
c5) placing the micro/nano textured mould in contact with the coated first surface of the light emitting substrate/cover, the micro/nano texturation of the mould facing the first surface, such that the micro/nano texturated surface of the mould is immerged in the UV-curable resin;
c6) illuminating the UV-curable liquid photopolymer resin with UV light whereby inducing the hardening of the said photopolymer resin by photopolymerization to generate a positive replica of the mould on the substrate;
c7) separating the mould from the positive replica to obtain an optical layer with a nano/micro texturation on one surface of the optical layer 450 (see FIG. 9).

Figure 10:
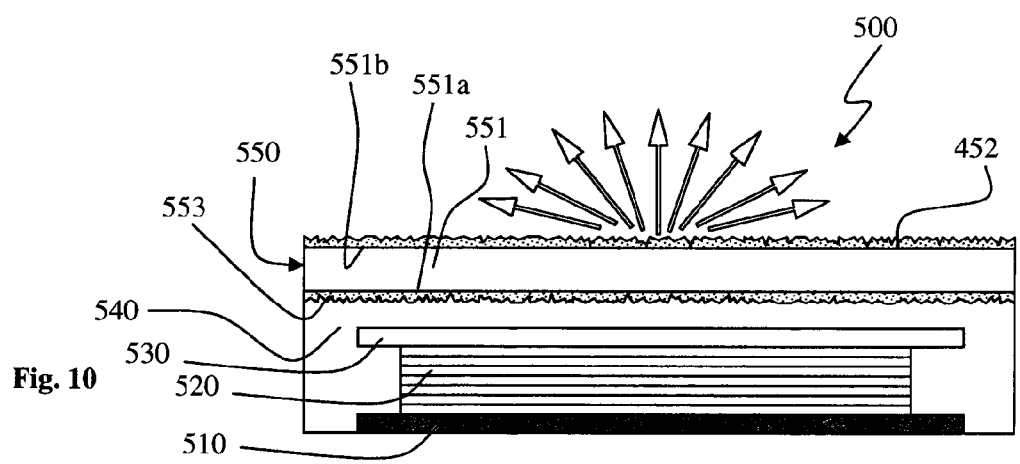
FIG. 10 is a sectional view illustrating an embodiment of an organic light emitting device of top emitting configuration having an optical layer comprising nano/micro texturation based on laser speckle lithography.

In some configurations, it may be necessary to manufacture an optical layer with two nano/micro texturised surfaces (for example for top emitting configuration OLED; see description concerning FIG. 10).

To this aim, the method according to the invention further comprises the following steps:
c8) coating a second surface of the substrate/cover, opposite to the first micro/nano textured surface, with a UV-curable resin;

c9) repeating steps c5) to c7) to obtain an optical layer with a nano/micro texturation on two surfaces of the optical layer 550 (see FIG. 10).

The method according to the invention is therefore cheap, rapid and easy to control because the patterned mould is obtained by a random light exposure, and does not necessitate a complex manufacture of masks to obtain a regular patterned texturation. The pattern according to the invention can be copied very faithfully, at all scales, from nanometers to a few millimeters. It does not necessitate perfect alignment of masks to generate the texturation on one face of the optical layer. Furthermore, this method is very polyvalent because it does not need complex steps of perfect realignment of masks to make a texturation on two surfaces of the optical layer.

The surface(s) of the optical layer according to the invention could be defined as follows. As the speckle grains have specific sectional intensity profile (as Gaussian, $\sin^2$, lorentzian, etc. and a combination thereof), the nano/micro texturation of the surface is composed by bumps with specific relief shape profile (as Gaussian, $\sin^2$, lorentzian, etc. and a combination thereof).

The surface according to the invention is characterized in that the nano/micro texturation comprises bumps randomly distributed on the surface, the bumps having size/diameter following a statistic distribution showing one peak.

The statistic distribution of the size/diameter may be obtained classically by a picture analysis of the surface. Spatial frequency analysis as Fourier transform or grain/pore analysis are complementary method to characterize the surface.

The fact that the size of the bumps follows a statistic distribution showing one peak derives directly and unambiguously from the use of coherent electromagnetic radiation speckle lithography according to the invention. If the micro/nano texturation is made by a full random system (it means without speckle lithography), spatial frequency analysis made by Fourier transform lead to a negative exponential distribution. In the case of speckle, spatial frequency analysis exhibit a negative exponential distribution added of a peak at frequency corresponding to speckle grain size.

It is important to establish whether the optical layer manufactured according to the invention is capable of achieving an enhancement in extraction efficiency. The following method may be used as quality control method to check whether the different parameters of the device used for carrying out the manufacturing method according to the invention need to be resettled.

Figure 7:
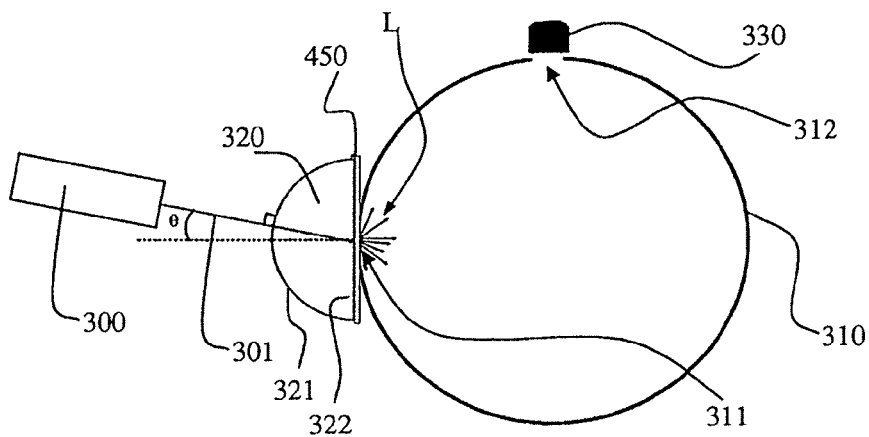
FIG. 7 is a sectional view illustrating a device for testing the efficiency of an optical layer manufactured according to the invention.

For testing the optical layer manufactured by the manufacturing method according to the invention (for quality test for example), the invention proposes a method illustrated in FIG. 7 and comprising the step α) of providing a light device 300 able to generate a laser beam 301, an integrated sphere 310 having a light inlet 311 and a light outlet 312, an hemispherical lens 320 with a flat face 322 and an hemispherical face 321, a photo detector 330 (such as a photodiode), a recorder (not represented in FIG. 7) of a light signal extraction detected by the photo detector 330, and an optical layer 450 (or 550) having at least one surface with a nano/micro texturation made by laser speckle lithography.

The method further comprises the following steps:
β) placing the optical layer 450 facing the light inlet 311, and the flat face 321 of the hemispherical lens 320 in contact with the optical layer 450. The integrating sphere is therefore able to collect the light diffused by the optical layer surface; advantageously, oil or gel is placed between the optical layer and the hemispheric lens in order to ensure a good optical continuity between lens and sample during characterization. The optical index of this oil or gel has to be chosen in consequence;

γ) placing the photo detector 330 facing the light outlet;

δ) actuating the light device 300 to generate a laser beam 301 and moving the light device 300 such as the laser beam 301 is directed to the hemispherical face 322 of the hemispherical lens 320 with a normal incidence and go through the lens 320 and intercepts the optical layer 450 with an angle of incidence θ changing while the light device moves. Therefore, the laser beam is directed to a hemispheric lens in order to have a normal incidence on the hemispherical face 322 of the hemispherical lens 320 for each studied angle;

ε) recording the light signal extraction L detected by the photo detector 330 while the angle of incidence θ changes.

Advantageously, the light inlet 311 and the light outlet 312 are arranged with an angle of 90° between each other.

The principle of this measure is to quantify the optical layer transmission for each incidence angle θ from normal incidence to 90 degrees. All these angles are representative of those generated in an OLED device.

Figure 8:
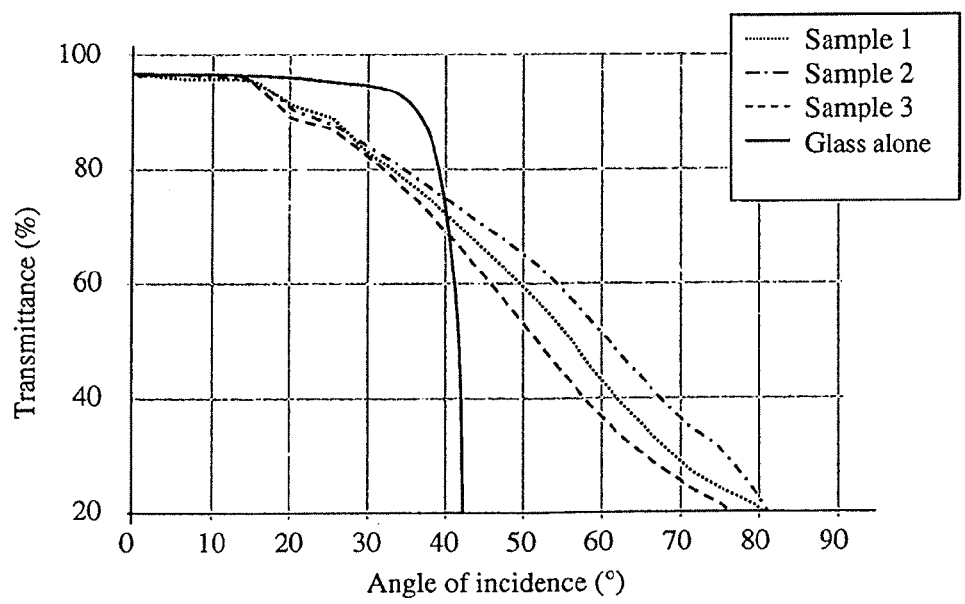
FIG. 8 is a graph depicting variation in extraction efficiency depending on angle of incidence θ for three optical layers manufactured according to the invention in comparison with a glass support with no surface texturation.

The recorded signal L is illustrated in FIG. 8 for three optical layers manufactured according to the invention in comparison with a glass support with no surface texturation.

Differences between optical layers are mainly due to different experimental recording parameters on the mastering process.

In the present example, this is the distance "d" between diffuser and sample as shown on FIG. 4. The best sample (sample 2) corresponds to the smallest speckle grain size (around 600 nm) and sample 3 corresponds to higher speckle grain size. Sample 1 is an intermediate case.

The graph of FIG. 8 shows the interface transmittance in function the angle of incidence θ. Shape of the curves show clearly that transmission is permitted in the angular region where common flat surfaces are submitted to total internal reflexion. Integration of this angular dependence improves the surface transmittance when a flat surface transmits only 20%. Results of the integration over the incidence hemisphere are shown on the following table:

| Sample # | Integrated transmittance |
| --- | --- |
| 1 | 54% |
| 2 | 59% |
| 3 | 50% |
| Glass alone | 22% |

These results show clearly that a nano/micro texturation made by laser speckle lithography could improve the light transmittance of an optical layer in the conditions of total internal reflection with a factor between 2 and 3.

The optical layer manufactured by the method according to the invention comprises at least one surface with nano/micro texturation based on laser speckle lithography.

The micro/nano texturation obtained has a laser speckle-like texture. The results are random subwavelenght grating/surface relief which act as gradient effective refractive index medium.

This improved optical layer is advantageously used to manufacture a light emitting device, in particular, but not exclusively an OLED.

One advantage of the invention is that the method may be easily used with top emitting OLED and bottom emitting OLED.

A bottom emitting OLED 400 according to the invention is illustrated in FIG. 9.

The invention relates to a method for manufacturing a light emitting device of bottom emitting configuration having an internal source of light, the method comprising the following steps:

d) providing an optical layer made by the method according to the invention, having one surface with a nano/micro texturation and a coating surface not having micro/nano texturation;

e) coating a transparent electrode on the coating surface of the optical layer;

f) coating the internal source of light on the transparent electrode;

g) coating a second electrode on the internal source of light; the electrodes being used to actuate the internal source of light.

More particularly, to manufacture a bottom emitting OLED 400, an optical layer 450 made by the method according to the invention is provided. It comprises a transparent substrate 451 (for example in glass), with one surface 451a with a nano/micro texturation 452 and a coating surface 451b unequipped with micro/nano texturation.

Then, a transparent electrode 410 is coated on the coating surface 451b of the optical layer. This electrode 410 may be made of ITO (Indium tin oxide). The transparent electrode may also be made with a very thin coated aluminium or silver (or thin metal).

The internal source of light 420 is then coated on the transparent electrode 410. The internal source of light 420 is an OLED stack.

For ending, a second electrode 430 is coated on the internal source of light 420. Classically, this electrode 430 is made with a reflective material to enhance light extraction. The electrodes are used to actuate the internal source of light.

A top emitting OLED 500 according to the invention is illustrated in FIG. 10.

The invention relates to a method for manufacturing a light emitting device of top emitting configuration, having an internal source of light, the method comprising the following steps:

d') providing a first electrode also used as a substrate;

e') coating the internal source of light on the first electrode;

f') coating a transparent electrode on the internal source of light, the electrodes being used to actuate the internal source of light;

g') coating an optical index matching layer on the transparent electrode, the optical index matching layer having a same refractive index as the transparent electrode h') coating an optical layer made by the method according to the invention, having two opposite surfaces with a nano/micro texturation, on the optical index matching layer.

More particularly, to manufacture this top emitting OLED 500, first electrode 510, also used as a substrate, is provided. This electrode 510 is advantageously made with a reflective material to enhance light extraction.

The internal source of light 520 is coated on the first electrode 510. The internal source of light 520 is an OLED stack.

Then, a transparent electrode 530 is coated on the internal source of light 520. This electrode 530 may be made of ITO (Indium tin oxide).

An optical index matching layer 540 is then coated on the transparent electrode 530, the optical index matching layer 540 having a refractive index depending on the electrode type. If this one is ITO (or equivalent transparent conductive material), then index of the optical index matching layer has to be the same than transparent electrode. If the electrode is Al or Ag (thin metal) the index of the optical index matching layer has to be the one of OLED stack.

More generally, if the light emitting device is not an OLED, the optical index matching layer has to be preferably the same as the internal source of light.

For ending, an optical layer 550 made by the method according to the invention, and having a transparent substrate 551 (for example in glass), comprising two opposite surfaces 551a and 551b with a nano/micro texturation 552, is coated on the optical index matching layer 540.

Because OLED stack has a refractive index close to 1.7, light goes out of the stack with very important losses due to total internal reflection. Consequently the invention proposes to make refractive index continuity between OLED stack and the optical layer 550 according to the invention. This is materialized by the specific optical index matching layer 540 which routes the rays to the optical layer 550 without any direction changes and losses from TIR.

The invention therefore ensures the index of refraction continuity from the internal source of light to the first micro/nano texturized surface 551a.

The micro/nano texturation by laser speckle lithography on each surfaces 551a and 551b limits TIR.

For ending, the method according to the invention allows to make light emitting device with an internal source of light and an optical layer separating the internal source and external medium, wherein the optical layer comprises at least one surface with nano/micro texturation based on laser speckle lithography.

More precisely, the light emitting device made by the method according to the invention comprises an optical interface layer comprising at least one surface with nano/micro texturation having bump average size/diameter in the range of 200 nm to 20 μm, preferably in the range of 200 nm to 5 μm, more preferably around 500 nm, having a distance between bumps in the range of 200 nm to 20 μm, preferably in the range of 200 nm to 5 μm, more preferably around 500 nm, respectively with a ratio between the length and the distance between speckle grains in the range of 0.5 to 5, preferably in the range of 2 to 4, more preferably of 4.

A method to characterize a light emitting device and/or an optical layer made by the method according to the invention may be as follows:

A SEM (scanning electron microscope) photography is performed to obtain a speckle grain pattern, followed by an image analysis. Speckle has a particular shape in terms of 2D image Fourier transformation. Fourier transform of a speckle grain pattern shows a peak corresponding to spatial frequency associated with the size/diameter of grains. Due to the fact that speckle grains may pile up along z axis, this peak may be very broad.

Numerous alternatives may be added without exiting from the scope of the invention. Indeed, numerous parameters may be optimized. For example, the light extraction solution according to the invention may be combined with an appropriate index matching of the optical stack.

The invention claimed is:

1. A method for manufacturing an optical layer for an organic light emitting device having a planar, internal and lambertian source of light having a refractive index and an optical layer separating the internal source of light and an external medium of light diffusion having a refractive index lower than the source of light, characterized in that it comprises the use of coherent electromagnetic radiation speckle lithography to make a nano/micro texturation on at least one surface of the optical layer.

2. The method according to claim 1, comprising the following steps:
   a) providing a sensitive material chosen to have a linear sensibility in the range of wavelength of a coherent electromagnetic radiations source to be used;
   b) recording an intensity pattern generated by coherent electromagnetic radiations speckle onto the sensitive material;
   c) replicating the nano/micro texturation by nano-imprint technique onto at least one surface of the optical layer.

3. The method according to claim 2, wherein step b) comprises the following steps:
   b1) providing a laser as coherent electromagnetic radiations source, and a photosensitive material as sensitive material, a laser beam expander and a light diffuser, the laser having a wavelength in the range of photosensitive material sensibility;
   b2) arranging the photosensitive material at a distance (d) of the light diffuser determined in function of an expected speckle grain mean size of the pattern;
   b3) actuating the laser in direction of the light diffuser through the laser beam expander to expand the laser beam and then to diffuse the expanded laser beam, thus generating a laser speckle;
   b4) exposing the photosensitive material by the laser speckle in order to generate a photosensitized part in the photosensitive material;
   b5) removing the photosensitized part to reveal a nano/micro texturation on a part of the photosensitive material not having been exposed to the laser speckle.

4. The method according to claim 3, wherein the light diffuser comprises an adjustable optical aperture means, and in step b2) distance (d) of the light diffuser and optical aperture of the adjustable optical aperture means are both determined in function of the expected speckle grain mean size.

5. The method according to claim 3, wherein in step b4) the illuminated photosensitive material is immersed in solvent which removes linearly the photosensitised part from the photosensitive material.

6. The method according to claim 2, wherein step c) comprises the following steps:
   c1) using the part of the sensitive material not having been exposed to the coherent electromagnetic radiations speckle as a nano/micro textured master;
   c2) preparing a micro/nano textured mould by coating the nano/micro textured master with a solidifiable material such as a poly-dimethyl siloxane (PDMS) gel;
   c3) performing a conformal solidification and, after conformal solidification, removing the solidified material by peeling it off from the nano/micro textured master, to obtain a micro/nano textured mould;
   c4) coating a first surface of a substrate to be used as the optical layer with a UV-curable resin;
   c5) placing the micro/nano textured mould in contact with the coated first surface of the substrate, the micro/nano texturation of the mould facing the first surface, such that the micro/nano texturation is immerged in the UV-curable resin;
   c6) illuminating the UV-curable liquid photopolymer resin with UV light whereby inducing the hardening of the said photopolymer resin by photopolymerization to generate a positive replica of the mould on the substrate;
   c7) separating the positive replica from the mould to obtain an optical layer with a nano/micro texturation on one surface of the optical layer.

7. The method according to claim 6, wherein step c) further comprises the following steps:
   c8) coating a second surface of the substrate, opposite to the first micro/nano textured surface, with a UV-curable resin;
   c9) repeating steps c5) to c7) to obtain an optical layer with a nano/micro texturation on two surfaces of the optical layer.

8. The method for testing the optical layer manufactured by the manufacturing method according to claim 1, comprising the following steps:
   α) providing a light device able to generate a laser beam, an integrated sphere having a light inlet and a light outlet, an hemispherical lens with a flat face and an hemispherical face, a photo detector, an recorder of a light signal extraction detected by the photo detector, and an optical layer having at least one surface with a nano/micro texturation made by laser speckle lithography
   β) placing the optical layer facing the light inlet, and the flat face of the hemispherical lens in contact with the optical layer;
   γ) placing the photo detector facing the light outlet
   δ) actuating the light device to generate a laser beam and moving the light device such as the laser beam is directed to the hemispherical face of the hemispherical lens with a normal incidence and go through the lens and intercepts the optical layer with an angle of incidence changing while the light device moves;
   ε) recording the light signal extraction detected by the photo detector.

9. The method according to claim 8, wherein the light inlet and the light outlet are arranged with an angle of 90° between each other.

10. An organic light emitting device with a planar, internal and lambertian internal source of light having a refractive index and an optical layer separating the internal source and external medium of light diffusion having a refractive index lower than the refractive index of the source of light, susceptible to be obtained by the method according to claim 1, characterized in that the optical layer comprises at least one surface with nano/micro texturation based on coherent electromagnetic radiation speckle lithography.

11. The organic light emitting device according to claim 10, wherein the nano/micro texturation comprises bumps having height following a statistic distribution showing one peak.

12. The organic light emitting device according to claim 10, wherein the optical layer comprises at least one surface with nano/micro texturation having bump average size/diameter in the range of 200 nm to 20 µm, having a distance between bumps in the range of 200 nm to 20 µm, respectively with a ratio between the length and the distance between speckle grains in the range of 0.5 to 5.

13. The method according to claim 1, wherein the coherent electromagnetic radiation speckle lithography is laser speckle lithography.

14. The method according to claim 2, wherein the sensitive material is a photoresin.

15. The organic light emitting device according to claim 10, wherein the coherent electromagnetic radiation speckle lithography is laser speckle lithography.

16. The organic light emitting device according to claim 12, wherein the bump average size/diameter is in the range of 200 nm to 5 µm.

17. The organic light emitting device according to claim 16, wherein the bump average size/diameter is around 500 nm.

18. The organic light emitting device according to claim 12, wherein the distance between bumps is in the range of 200 nm to 5 μm.

19. The organic light emitting device according to claim 18, wherein the distance between bumps is around 500 nm.

20. The organic light emitting device according to claim 12, wherein the ratio between the length and the distance between speckle grains is in the range of 2 to 4.

\* \* \* \* \*